(12) United States Patent
Schrems et al.

(10) Patent No.: US 6,777,303 B2
(45) Date of Patent: Aug. 17, 2004

(54) METHOD FOR FABRICATING AN INSULATION COLLAR IN A TRENCH CAPACITOR

(75) Inventors: Martin Schrems, Eggersdorf (AT); Anke Krasemann, Dresden (DE); Moritz Haupt, Poughkeepsie, NY (US); Sabine Steck, Bad Säckingen (DE); Daniel Köhler, Dresden (DE)

(73) Assignee: Infineon Technologies AG, Munich (DE)

( * ) Notice: Subject to any disclaimer, the term of this patent is extended or adjusted under 35 U.S.C. 154(b) by 102 days.

(21) Appl. No.: 10/153,045

(22) Filed: May 22, 2002

(65) Prior Publication Data

US 2002/0182819 A1 Dec. 5, 2002

Related U.S. Application Data (63) Continuation-in-part of application No. PCT/DE00/04114, filed on Nov. 22, 2000.

(30) Foreign Application Priority Data

Nov. 22, 1999 (DE) .......................................... 199 56 078

(51) Int. Cl.$^7$ ................................................. H01L 21/20
(52) U.S. Cl. ....................... 438/386; 438/243; 438/270; 438/700
(58) Field of Search ................................. 438/386, 675, 438/690, 700, 733, 739, 745, 243, 270

(56) References Cited

U.S. PATENT DOCUMENTS

| | | | |
|---|---|---|---|
| 5,342,792 A | * | 8/1994 | Yonehara .................... 438/386 |
| 5,422,294 A | | 6/1995 | Noble, Jr. |
| 5,521,114 A | | 5/1996 | Rajeevakumar |
| 5,677,219 A | * | 10/1997 | Mazure et al. .............. 438/243 |
| 5,824,580 A | * | 10/1998 | Hauf et al. .................. 438/243 |
| 5,827,765 A | * | 10/1998 | Stengl et al. ................ 438/243 |
| 5,849,638 A | | 12/1998 | Ho et al. |
| 5,891,807 A | | 4/1999 | Muller et al. |
| 5,909,044 A | | 6/1999 | Chakravarti et al. |
| 5,937,292 A | * | 8/1999 | Hammerl et al. ........... 438/243 |
| 5,937,296 A | * | 8/1999 | Arnold ....................... 438/270 |
| 5,945,704 A | | 8/1999 | Schrems et al. |
| 6,008,104 A | | 12/1999 | Schrems |
| 6,310,375 B1 | | 10/2001 | Schrems |

FOREIGN PATENT DOCUMENTS

| | | | | |
|---|---|---|---|---|
| DE | 989603 A2 | * | 3/2000 | ....... H01L/21/8242 |
| EP | 0 735 581 A1 | | 10/1996 | |
| EP | 0 942 465 A2 | | 9/1999 | |
| EP | 0 949 680 A2 | | 10/1999 | |
| EP | 0 949 684 A2 | | 10/1999 | |
| WO | WO 01/17014 A1 | | 3/2001 | |

OTHER PUBLICATIONS

Wolf, "Silicon Processing for the VLSI Era—vol. 2", p. 52, 1990.*

* cited by examiner

*Primary Examiner*—Evan Pert
*Assistant Examiner*—Lisa Kilday
(74) *Attorney, Agent, or Firm*—Laurence A. Greenberg; Werner H. Stemer; Ralph E. Locher (57) ABSTRACT

A trench capacitor is formed with an insulation collar. After the formation of the trench, firstly an insulating layer is deposited, from which layer the insulation collar will be subsequently formed. Afterward, the trench is partly filled with a sacrificial filling material and a thin patterning layer is deposited thereon. Spacers are formed from that layer and cover the insulating layer in the upper region of the trench. Afterward, the sacrificial filling material and the insulating layer are completely removed in the lower region of the trench. As a result, the insulation collar is produced in the upper region of the trench.

20 Claims, 5 Drawing Sheets

METHOD FOR FABRICATING AN INSULATION COLLAR IN A TRENCH CAPACITOR

CROSS-REFERENCE TO RELATED APPLICATION

This application is a continuation of copending International Application No. PCT/DE00/04114, filed Nov. 22, 2000, which designated the United States and which was not published in English.

BACKGROUND OF THE INVENTION

Field of the Invention

The invention lies in the field of semiconductor memory fabrication and relates to a method for fabricating an insulation collar in a trench capacitor.

Volatile semiconductor memories (RAM) generally have a storage capacitor and a selection transistor in each individual memory cell. The storage capacitor can either be formed as a so-called stacked capacitor above the silicon substrate or be introduced in the form of a depression extending into the semiconductor substrate. This depression generally has an aspect ratio of greater than 20:1 and is usually referred to as a trench by experts.

A memory cell of that is described in U.S. Pat. No. 5,909,044, for example. In the case of that memory cell, the conductive filling of the trench, which forms the inner electrode of the capacitor, is insulated from the active regions of the assigned selection transistor by means of an insulation collar in the upper region of the trench. In accordance with U.S. Pat. No. 5,909,044 the collar is formed by thermal oxidation of the semiconductor substrate in the upper region of the trench after partial filling of the trench with polysilicon. Valuable semiconductor substrate area is consumed in the process. In order to minimize the area consumed, in the method mentioned it is necessary for the trenches to be formed correspondingly narrower. However, this increases the aspect ratio of the trenches, which are thus more difficult to etch. Furthermore, an undesirable so-called bird's beak can form during the oxidation during the transition from the insulation collar to the adjoining dielectric.

The same problems also occur in the case of the method in accordance with U.S. Pat. No. 5,937,292, since the insulation collar is formed by thermal oxidation in that case, as well.

In accordance with a further method described in in U.S. Pat. Nos. 6,008,104 and 6,310,375 (European patent application EP 0 949 680 A2), the insulation collar is formed by conformal deposition of an insulating layer with subsequent anisotropic etching in the upper region of the collar. In this case, the insulating layer is deposited onto the trench, which is partly filled with a sacrificial filling material. Since the sacrificial filling material must be removed again from the trench after the deposition of the insulating layer, it is necessary to form an opening in the insulating layer toward the sacrificial filling material. This opening is formed by the aforementioned anisotropic etching. Since the insulating layer must have a certain thickness in order to be able to serve as an insulation layer, the cross section of the trench is greatly constricted by the insulating layer. Moreover, the insulating layer often has a larger thickness on the sacrificial filling material than on the sidewalls of the trench, so that the opening to be formed can only be formed with a major overetching of the insulating layer. In this case, it can happen, however, that the insulating layer is etched back from the upper edge of the semiconductor material by the anisotropic etching and, consequently, is no longer present there as insulation layer. Therefore, the method described therein is not suitable for fabricating trench capacitors with a small cross section. The same problems also occur in European application EP 0 949 684 A2 and U.S. Pat. No. 5,945,704.

SUMMARY OF THE INVENTION

It is accordingly an object of the invention to provide a method of fabricating an insulation coller in a trench capacitor, which overcomes the above-mentioned disadvantages of the heretofore-known devices and methods of this general type and which ensures the formation of a reliable insulation collar, even when the trench capacitor has a small cross section.

With the foregoing and other objects in view there is provided, in accordance with the invention, a method of fabricating an insulation collar in a trench capacitor, which comprises the steps of:

a) providing a semiconductor substrate;

b) forming a trench in the semiconductor substrate;

c) forming an insulating layer in the trench in order to form an insulation collar;

d) subsequently filling a lower region of the trench, the lower region extending up to a predetermined height, with a sacrificial filling material, so that an upper region of the trench, the upper region extending above the predetermined height, remains uncovered by the sacrificial filling material;

e) forming a patterning layer that is relatively thin in comparison with the insulating layer on the insulating layer and on the sacrificial filling material in the trench;

f) forming an opening in the patterning layer toward the sacrificial filling material, the patterning layer remaining on the insulating layer in the upper region of the trench;

g) subsequently removing the sacrificial filling material from the trench; and h) removing the insulating layer from the lower region of the trench by etching the insulating layer selectively with respect to the patterning layer, so that the insulation collar is produced in the upper region of the trench.

It will be seen that the deposition of the insulating layer, from which the insulation collar is formed, before the trench is partly filled with a sacrificial filling material, lies at the heart of the invention. As a result, firstly an insulating layer having an approximately uniform thickness is formed on the sidewalls of the trench. This is followed by the partial filling of the trench with a sacrificial filling material up to a predetermined height. This height approximately defines the boundary region between an upper and a lower region of the trench. After filling with the sacrificial filling material, a usually thin patterning layer is deposited in the upper region of the trench and an opening toward the sacrificial filling material is formed in said layer. In this case, however, the S insulating layer continues to be covered by the patterning layer. The patterning layer is preferably formed such that it is significantly thinner than the insulating layer, so that its thickness on the sacrificial filling material is likewise significantly smaller. As a result, this patterning layer can also be removed relatively easily from the sacrificial filling material. Major overetching is not necessary here. Once the opening has been formed in the patterning layer, the sacrificial filling material is removed from the trench. This can be done for example by means of a wet-chemical etching selectively with respect to the patterning layer. During the removal of the sacrificial filling material, the relatively thick insulating layer also simultaneously serves as an etching stop layer and thus protects the semiconductor substrate from an attack by the etching chemicals. Isotropic dry-chemical removal of the sacrificial layer selectively with respect to the insulating layer and patterning layer is also possible (e.g. using $SF_6$ in the case of amorphous silicon or polysilicon as sacrificial filling material). After the removal of the sacrificial filling material, the insulating layer is uncovered in the lower region of the trench and can be removed by etching selectively with respect to the patterning layer. In this case, the insulating layer remains only in the upper region of the trench and forms the insulation collar there.

With the method according to the invention, the problems which occur in U.S. Pat. Nos. 6,008,104 and 6,310,375 (EP 0 949 680 A2) are avoided, so that even trench capacitors having a significantly smaller cross section can be fabricated. Therefore, this method can also be employed with structure widths (cross section) of $\leq 100$ nm.

A further advantage is that the insulating layer is firstly applied completely and then removed by etching from the lower region of the trench. This produces very smooth transitions from the insulation collar to the lower region of the trench, which facilitate the filling of the entire trench with a conductive material.

The insulating layer and the sacrificial filling material should preferably be composed in each case of a material which can be etched selectively with respect to the material of the patterning layer. Furthermore, it is favorable if the sacrificial filling material can also be etched selectively with respect to the insulating layer. As a result, the insulating layer can act as an etching stop layer during the removal of the sacrificial filling material.

The fabrication of the trench capacitor is advantageously concluded, after the formation of the insulation collar, by the trench being lined with a dielectric and finally being filled with a conductive material in order to form a further electrode of the trench capacitor. The other electrode is formed by the semiconductor substrate in this case. Said substrate can be suitably doped before the lining of the trench with a dielectric.

In order to enlarge the capacitor area, the lower region of the trench is suitably enlarged after the formation of the insulation collar by an etching strip, so that the trench capacitor has a bottle shape in longitudinal section.

Furthermore, it is preferred that a thermal oxide is formed before the deposition of the insulating layer on the sidewalls of the trench. Said thermal oxide has only a relatively small thickness, so that hardly any semiconductor material is consumed.

It is also possible to form the thin thermal oxide after deposition of the insulating layer below the latter by means of oxidation through the insulating layer. Furthermore, a thermal annealing step is favorable, by means of which the insulating layer is densified and the interfaces to the thermal oxide and to the semiconductor substrate are sealed. This reduces leakage currents from the outer electrode of the trench capacitor to the selection transistor along the insulating layer.

Other features which are considered as characteristic for the invention are set forth in the appended claims.

Although the invention is illustrated and described herein as embodied in a method for fabricating an insulation collar in a trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawing in detail and first, particularly, to FIGS. 1A to 1I thereof, there is shown a semiconductor substrate 5, for example made of silicon, wherein a trench 10 is formed. For the purpose of forming the trench 10, a thin oxide layer 15 and a thick nitride layer 20 and also a hard mask layer (not shown; e.g. made of TEOS or BSG) are deposited onto a surface 22 of the semiconductor substrate and patterned suitably by lithographic methods. This produces a hard mask which is used during the anisotropic etching of the trench 10. The non-illustrated hard mask is then removed. The cross section of the trench 10 may be from 70 to 300 nm, for example, depending on the structure width used. By contrast, its depth is generally between 4 and 10 $\mu$m.

Figure 1A:
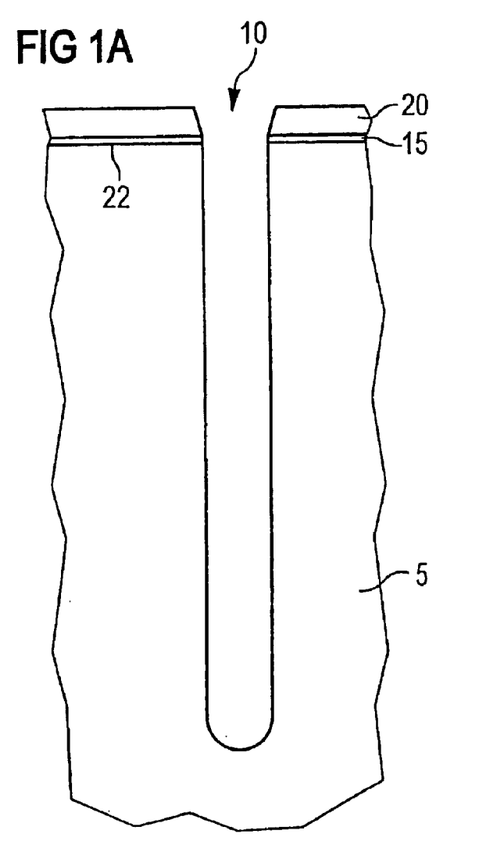
FIGS. 1A to 1I are partial vertical sections showing individual method steps of the fabrication method according to the invention.

After the formation of the trench 10, firstly a thermal oxide layer 25 having a thickness of a few nanometers is formed on the sidewalls 30 of the trench 10. This is followed by the formation of an insulating layer 35 in the trench 10. Said layer may be composed, for example, of an oxide, an oxynitride, a nitride or another suitable material having a low dielectric constant with thermal stability. Silicon oxide, silicon oxynitride and silicon nitride are preferred. These materials can be deposited to the greatest possible extent conformally for example by means of a CVD method (Chemical Vapor Deposition), LPCVD method (Low Pressure Chemical Vapor Deposition) or PECVD method (Plasma Enhanced Chemical Vapor Deposition). If the insulating layer 35 is composed of an oxide, the latter can be deposited by means of an LP-TEOS method (tetraethyl orthosilicate) or by a CVD-TEOS method in the presence of ozone. It is also possible to form the insulating layer 35 by thermal oxidation.

Figure 1B:
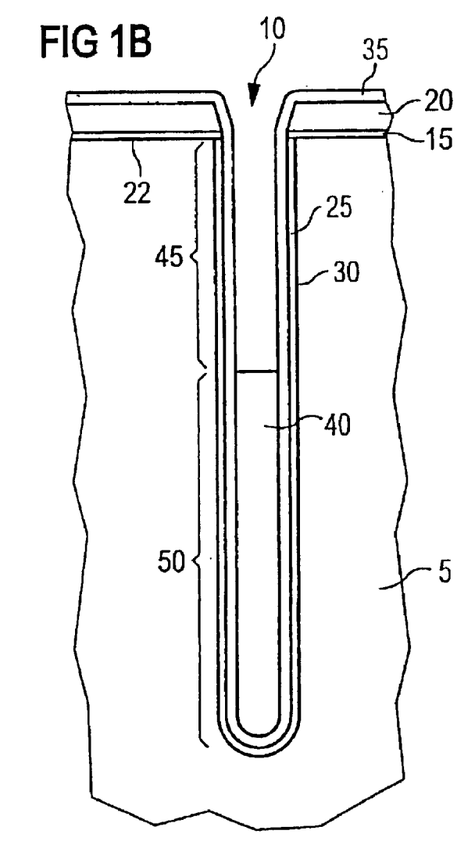
Figure 1C:
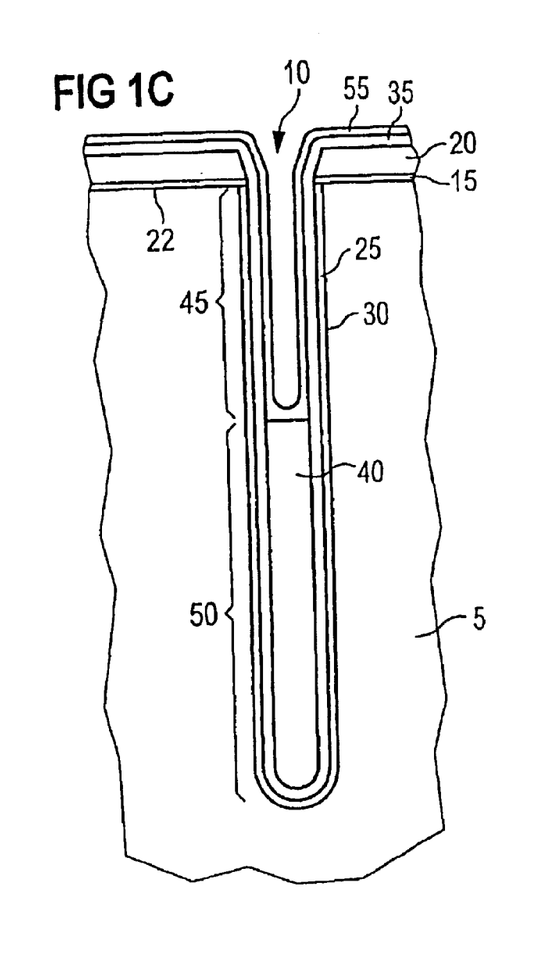
Figure 1D:
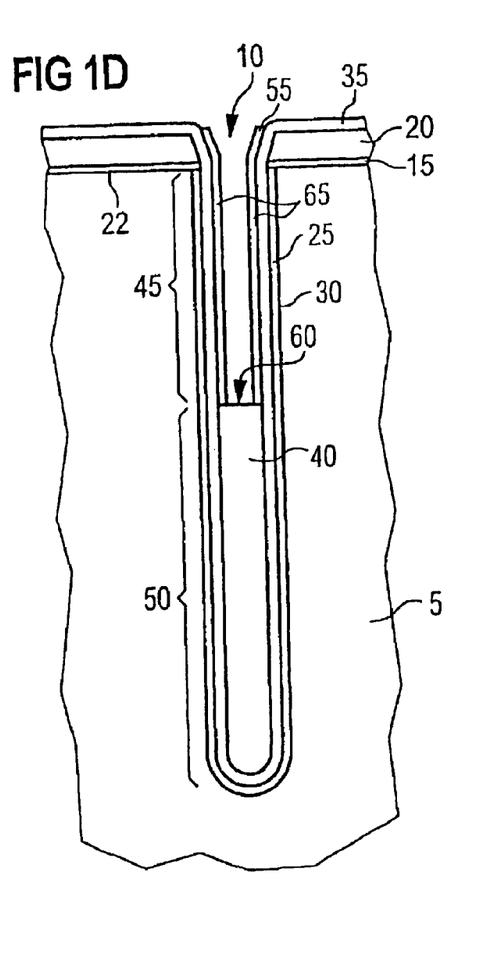

After the formation of the insulating layer 35, the latter is exposed to an oxidation or a heat treatment at about 1000° C. for 20 to 90 minutes in a nitrogen-containing atmosphere. This on the one hand densifies the material of the insulating layer 35 and on the other hand seals the transitions between insulating layer 35, thermal oxide layer 25 and semiconductor substrate 5, in order to avoid leakage current paths. If the insulating layer 35 is composed of an oxide or an oxynitride, the thermal oxide layer 25 can be formed after the deposition of the insulating layer 35 by oxidation, so that the insulating layer 35 is deposited directly onto the sidewalls 30 of the trench. If appropriate, the oxidation of the insulating layer 35 and the densification thereof can be combined in a single thermal step. In a next method step, the trench is partly filled with a sacrificial filling material up to a predetermined height. The latter typically lies 1 to 2 μm below the surface 22 of the semiconductor substrate 5. As a result, the trench 10 is subdivided into an upper region 45 and a lower region 50. Suitable sacrificial filling materials are polysilicon, amorphous silicon, silicon nitride, silicon oxynitride or polymer resists. The polysilicon and the amorphous silicon can be doped or undoped. The partial filling of the trench is generally effected by the trench 10 firstly being largely completely filled with subsequent controlled etching-back of the sacrificial filling material 40 as far as the predetermined height. In the next method step, which is illustrated in FIG. 1C, a patterning layer 55 is deposited onto the insulating layer 35 and the sacrificial filling material 40. The patterning layer 55 is formed such that it is relatively thin, for instance between 2 and 10 nm, preferably less than or equal to 5 nm. Suitable materials are silicon nitride, amorphous silicon, polysilicon or a silicon-rich polymer resist (e.g. as photoresist) which is cured for example by silylation. Such a resist is known for example under the designation CARL top resist. Since the thickness of the patterning layer 55 on the sacrificial filling material 40 is relatively small, the patterning layer 55 can also be removed relatively easily therefrom. This step is illustrated in FIG. 1D. If the patterning layer 55 is composed of silicon nitride, it is possible to form the opening 60 in the patterning layer 55 above the filling material 40 by anisotropic etching by means of reactive ion etching for example using fluorine-containing chemicals ($CF_4$, $C_4F_8$) or an Ar/HBr mixture.

During the anisotropic etching of the patterning layer 55, the latter is simultaneously removed from horizontal areas, so that the patterning layer 55 remains in the form of lateral edge webs 65 (spacers) on the insulating layer 35 in the upper region 45 of the trench 10. The patterning layer 55 protects the insulating layer 35 there during the subsequent removal of the sacrificial filling material 40 and furthermore serves as an etching mask during the etching of the insulating layer 35. Therefore, the materials for the sacrificial filling material 40 and the insulating layer 35 should be chosen such that these can be etched selectively with respect to the patterning layer 45.

Furthermore, it is favorable if the sacrificial filling material 40 can be removed selectively with respect to the insulating layer 35. A number of suitable material combinations are listed in the table below:

| Sacrificial filling material | Insulating layer | Patterning layer |
|---|---|---|
| Polysilicon amorphous silicon (doped/undoped) | Silicon oxide | Silicon nitride |
| Polysilicon amorphous silicon (doped/undoped) | Silicon oxide Silicon oxynitride | Photoresist Silicon-rich polymer |
| Silicon nitride | Silicon oxide | Photoresist Silicon-rich polymer |
| Photoresist silicon-rich polymer | Silicon oxynitride | Silicon-rich polymer Silicon nitride (can be deposited at temperatures at which the sacrificial filling material does not yet burn, e.g. jet vapor deposition nitride) |
| Polysilicon amorphous silicon (doped/undoped) | Silicon nitride (if appropriate with thin oxide layer located underneath) | Photoresist silicon-rich polymer |

Figure 1E:
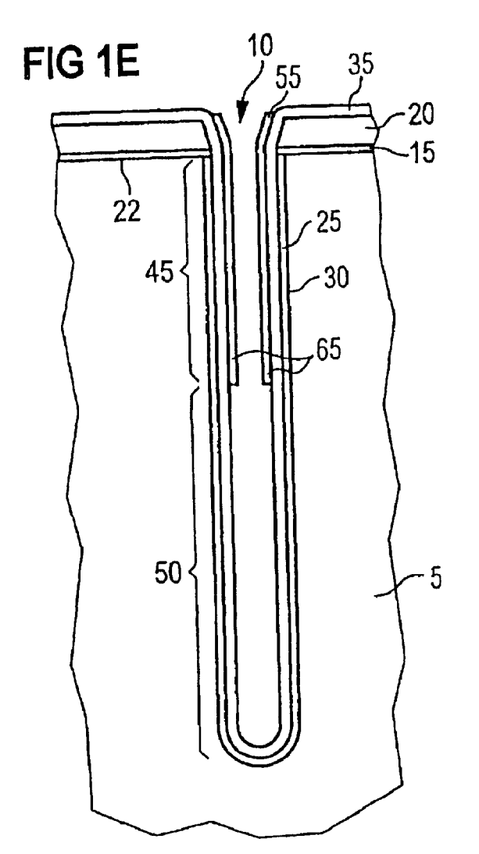

The structure obtained after the removal of the sacrificial filling material is illustrated in FIG. 1E. During the removal of the sacrificial filling material 40, the relatively thick insulating layer 35 simultaneously serves as an etching stop layer and therefore protects the semiconductor substrate 5 from an attack by the etching chemicals. The need for protection of the semiconductor substrate exists particularly if the semiconductor substrate and the sacrificial filling material are composed of silicon. In the case of the previously known methods (for example U.S. Pat. Nos. 6,008,104 and 6,310,375, and European patent application EP 0 949 680 A2), during the removal of the sacrificial filling material, there was always the risk of the semiconductor material being attacked. A thin oxide layer situated on the sidewalls of the trench in the case of this method generally did not suffice to protect the semiconductor substrate. In the case of the method according to the invention, this problem is solved in a simple manner by virtue of the applied insulating layer 35, from which the insulation collar is intended to be produced. This insulating layer 35 is generally between 20 and 50 nm thick and therefore withstands the attack by the etching chemicals for a longer time.

In the case of polysilicon, the sacrificial filling material 40 can be dry-etched selectively using sulfur fluoride ($SF_6$) or chlorine-containing chemicals ($CF_4/O_2/Cl_2$ or $NF_3/Cl_2$). Polysilicon or amorphous silicon can be removed wet-chemically selectively with respect to silicon nitride or silicon oxide by means of $NH_4OH$ or KOH. If the sacrificial filling material is composed of a nitride, the latter can be removed selectively with respect to oxide e.g. wet-chemically by means of phosphoric acid. Burning in an oxygen-containing atmosphere ($O_2$) or in a $CF_4/O_2$ atmosphere or wet-chemically in a Pirana solution ($H_2SO_4/H_2O_2$) is suitable for removing a polymer resist serving as sacrificial filling material 40.

Figure 1F:
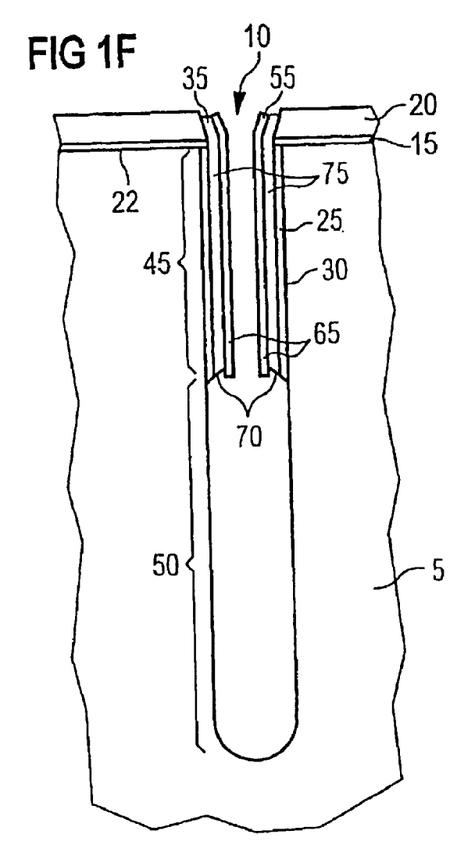

The removal of the sacrificial filling material 40 is followed by etching of the insulating layer 35 selectively with respect to the patterning layer 50. If the insulating layer 35 is composed of an oxide, it is removed by means of BHF selectively with respect to the patterning layer 55 composed of silicon nitride in the lower region 50 of the trench 10. In this case, slight undercuts 70 of the patterning layer 55 can occur, which are illustrated in FIG. 1F. They can be removed by brief etching using HF/EG (ethylene glycol) within one minute. It is also possible for the patterning layer 55 to be completely removed from the insulating layer 35.

During the etching of the insulating layer 35 selectively with respect to the patterning layer 45, the insulating layer 35 is completely removed from the nitride layer 20 situated on the surface 22 of the semiconductor substrate 5. As a result, the insulating layer 35 remains only in the upper region 45 of the trench 10 and forms the insulation collar 75 there.

Figure 1G:
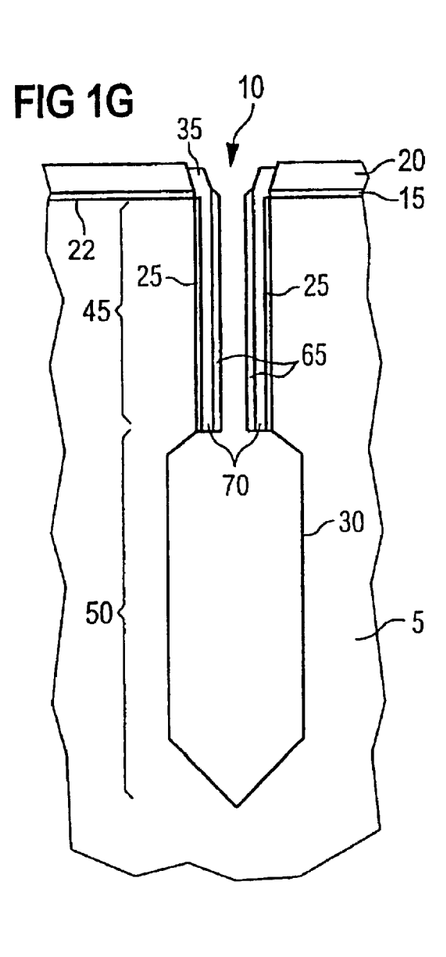

In a further method step, which is illustrated in FIG. 1G, the lower region 50 of the trench 10 is widened by etching the semiconductor substrate 5 selectively with respect to the patterning layer 55. The semiconductor substrate composed of monocrystalline silicon can be etched by wet-chemical anisotropic etching using $NH_4OH$ or KOH or by dry-chemical isotropic etching using $NF_3/CL_2$.

Further possibilities for widening the lower region 50 of the trench 10 can be gathered from U.S. Pat. Nos. 5,849,638 and 5,891,807, the disclosures of which are hereby incorporated in their entirety.

The widening of the lower region 50 serves for enlarging the useable capacitor area, in order thus to increase the storage capacitance. However, the widening process is not absolutely necessary, provided that the trench 10 is made deep enough.

Figure 1H:
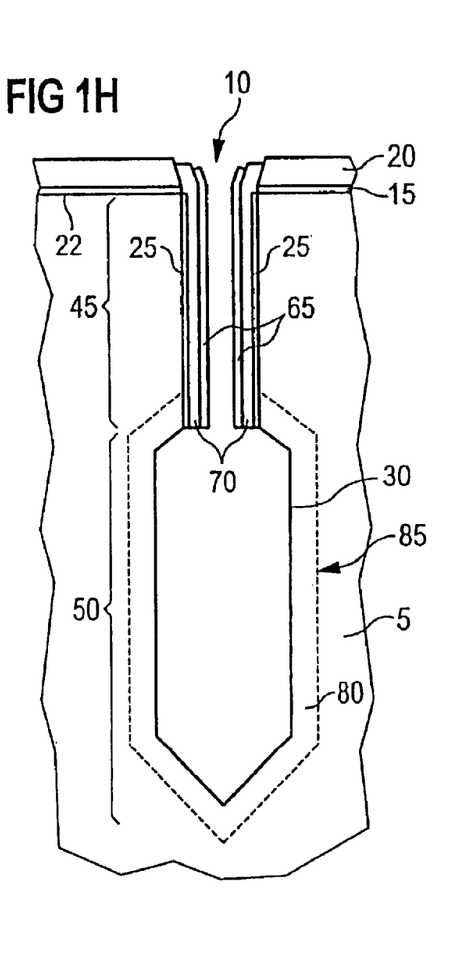

Afterward, the semiconductor substrate 5 is suitably doped in the lower region 50 of the trench 10 in order thus to form an electrode 80 of the trench capacitor 85. The semiconductor substrate 5 can be doped for example by gas phase doping at 950° C. for 30 to 60 minutes in an arsine atmosphere ($AsH_3$) or a phosphine atmosphere ($PH_3$). A further possibility consists in the deposition of an arsenic or phosphorus glass (AsG, PsG) onto the sidewalls 30 of the trench 10 and subsequent drive-in of the arsenic at 1050° C. for 30 minutes. The arsenic glass must then be removed for example by means of an HF-containing solution, the insulation collar 70, composed e.g. of an oxide, in this case being protected by the patterning layer 55, composed e.g. of a nitride layer. The result of this method step is shown in FIG. 1H.

Figure 1I:
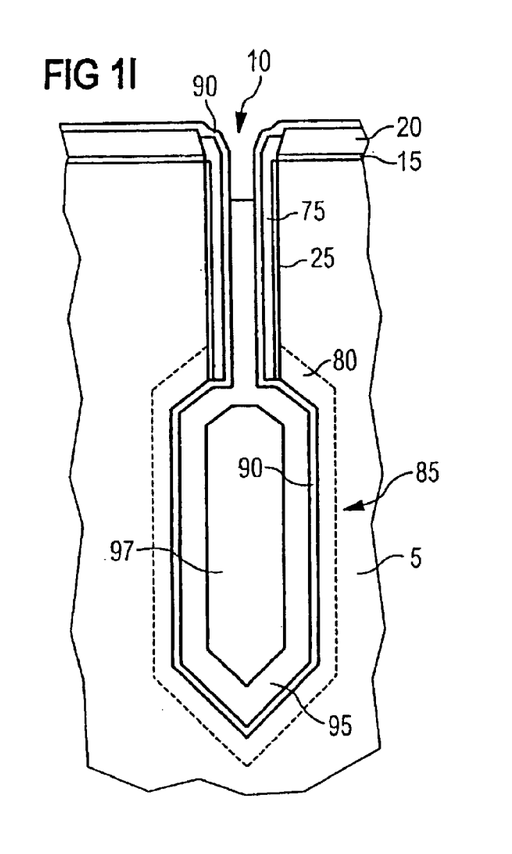

Finally, the trench 10 is lined with a dielectric 90 and filled with a conductive material 95, which is generally composed of highly doped polysilicon.

Since the deposition of the conductive material is preferably effected conformally, a cavity 97 may possibly remain within the conductive material 95, but said cavity does not have a disturbing effect on the electrical properties of the trench capacitor.

The conductive material 95 forms the further electrode 95, which is isolated from the other electrode 80 by the capacitor dielectric 90. The dielectric 90 can be constructed from one or from a plurality of layers, so-called ONO layers (oxide/nitride/oxide) often being employed. Other materials are, for example, tantalum pentoxide, titanium oxide or tungsten oxide. Before the formation of the dielectric 90, the patterning layer 55 can be removed. This enlarges the diameter of the upper region 45 of the trench 10 and facilitates the process of filling with the conductive material 95 (FIG. 1I).

The further steps for completing the trench capacitor 85 are described in the commonly assigned U.S. Pat. Nos. 6,008,104 and 6,310,375 (European patent application EP 0 949 680), the disclosures of which are hereby incorporated in their entirety.

Figure 2:
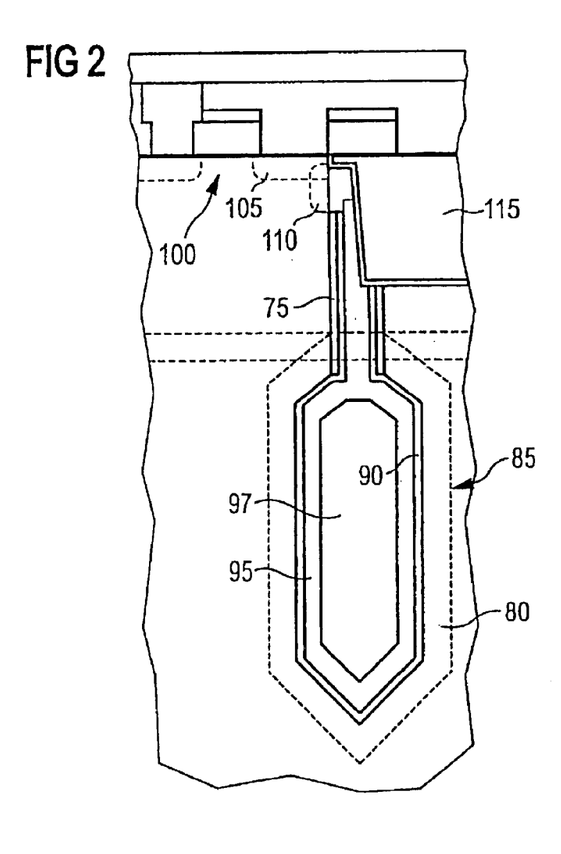
FIG. 2 is a partial vertical section showing a trench capacitor fabricated according to the invention with an assigned selection transistor.

FIG. 2 illustrates a completely fabricated memory cell with a trench capacitor 85 and assigned selection transistor 100. The latter is situated laterally above the trench capacitor 85, its source region 105 being electrically conductively connected to the further electrode 95 (inner electrode) via a buried connection 110.

The upper region 45 of the trench capacitor 85 and the assigned selection transistor 100 are isolated from adjacent transistors and trench capacitors by a so-called shallow trench isolation region 115. The dielectric 90 and the insulation collar 75 are only illustrated diagramatically in FIG. 2. Both have been etched back at least in the region of the buried connection 110 in order to enable the electrical contact between the conductive material 95 and the buried contact 110.

We claim:

1. A method of fabricating an insulation collar in a trench capacitor, which comprises the steps of:
    a) providing a semiconductor substrate;
    b) forming a trench in the semiconductor substrate;
    c) forming an insulating layer in the trench in order to form an insulation collar;
    d) subsequently filling a lower region of the trench, the lower region extending up to a predetermined height, with a sacrificial filling material, so that an upper region of the trench, the upper region extending above the predetermined height, remains uncovered by the sacrificial filling material;
    e) after step d) forming a patterning layer that is relatively thin in comparison with the insulating layer on the insulating layer and on the sacrificial filling material in the trench;
    f) forming an opening in the patterning layer toward the sacrificial filling material, the patterning layer remaining on the insulating layer in the upper region of the trench;
    g) subsequently removing the sacrificial filling material from the trench; and
    h) subsequent to step g), removing the insulating layer from the lower region of the trench by etching the insulating layer selectively with respect to the patterning layer, so that the insulation collar is produced in the upper region of the trench.

2. The method according to claim 1, wherein the insulating layer and the sacrificial filling material are composed in each case of a material that can be etched selectively with respect to a material of the patterning layer.

3. The method according to claim 1, which comprises using the semiconductor substrate to serve as an electrode of the trench capacitor and, after the forming the insulation collar in step h), carrying the following further steps:
    i) lining the trench with a dielectric; and
    j) filling the trench with a conductive material to form a further electrode of the trench capacitor.

4. The method according to claim 1, which comprises forming the insulating layer of a material selected from the group consisting of silicon oxide, silicon oxynitride, silicon nitride, and a combination thereof.

5. The method according to claim 1, which comprises forming at least one of the insulating layer and the patterning layer by a process of conformal deposition.

6. The method according to claim 1, which comprises depositing the insulating layer by a process selected from the group consisting of CVD, LP-CVD, and PE-CVD.

7. The method according to claim 1, which comprises forming a thermal oxide before forming the insulating layer on the sidewalls of the trench.

8. The method according to claim 7, which comprises, after forming the thermal oxide and the insulating layer, carrying out a thermal step for densifying the insulating layer.

9. The method according to claim 1, which comprises forming a thermal oxide after formating the insulating layer on the sidewalls of the trench below the insulating layer, by way of oxidizing the semiconductor substrate through the insulating layer.

10. The method according to claim 9, which comprises, after forming the thermal oxide and the insulating layer, carrying out a thermal step for densifying the insulating layer.

11. The method according to claim 1, wherein step d) comprises, filling the trench completely with the sacrificial filling material and subsequently etching the filling material down to the predetermined height.

12. The method according to claim 1, which comprises providing the sacrificial filling material as a material selected from the group consisting of polysilicon, amorphous silicon, silicon oxide, silicon nitride, and photoresist.

13. The method according to claim 1, which comprises forming the patterning layer from a material selected from the group consisting of silicon nitride, polysilicon, amorphous silicon, and photoresist.

14. The method according to claim 1, wherein the step of forming the opening comprises anisotropically etching the patterning layer.

15. The method according to claim 3, which comprises removing the patterning layer prior to step i).

16. The method according to claim 3, which comprises enlarging the lower region of the trench prior to step i) by etching the semiconductor substrate.

17. The method according to claim 16, which comprises etching the semiconductor substrate by isotropic dry-chemical etching.

18. The method according to claim 16, which comprises etching the semiconductor substrate by anisotropic wet-chemical etching.

19. The method according to claim 3, which comprises, prior to step i), forming the electrode in the semiconductor substrate by doping the semiconductor substrate in the lower region of the trench.

20. The method according to claim 19, wherein the step of doping the semiconductor substrate comprises gas phase doping or coating with a doping layer with subsequent indiffusion of the dopant into the semiconductor substrate.

* * * * *